(12) United States Patent
Yamamoto (10) Patent No.: US 11,226,594 B2
(45) Date of Patent: Jan. 18, 2022

(54) ELECTRONIC TIMEPIECE

(71) Applicant: Seiko Epson Corporation, Tokyo (JP)

(72) Inventor: Hironobu Yamamoto, Shiojiri (JP)

(73) Assignee: Seiko Epson Corporation

( * ) Notice: Subject to any disclaimer, the term of this patent is extended or adjusted under 35 U.S.C. 154(b) by 332 days.

(21) Appl. No.: 16/543,766

(22) Filed: Aug. 19, 2019

(65) Prior Publication Data

US 2020/0057413 A1 Feb. 20, 2020

(30) Foreign Application Priority Data

Aug. 20, 2018 (JP) .............................. JP2018-153992

(51) Int. Cl.
| | |
|---|---|
| *G04C 10/02* | (2006.01) |
| *G04G 17/06* | (2006.01) |
| *G04R 60/12* | (2013.01) |
| *G04R 20/02* | (2013.01) |
| *H02S 99/00* | (2014.01) |

(52) U.S. Cl.
CPC .............. *G04C 10/02* (2013.01); *G04G 17/06* (2013.01); *G04R 20/02* (2013.01); *G04R 60/12* (2013.01); *H02S 99/00* (2013.01)

(58) Field of Classification Search
CPC ........ G04C 10/02; G04G 17/06; G04G 17/04; G04G 19/00; G04G 17/08; G04G 21/04; G04R 20/02; G04R 60/12; G04R 60/10; G04R 20/04; H02S 99/00
USPC .......................................... 368/205, 47, 278
See application file for complete search history.

(56) References Cited

U.S. PATENT DOCUMENTS

| | | | | |
|---|---|---|---|---|
| 2011/0013491 | A1* | 1/2011 | Fujisawa ................ | G04C 10/02 368/10 |
| 2011/0187609 | A1 | 8/2011 | Abe | |
| 2012/0105288 | A1* | 5/2012 | Abe ....................... | G04G 21/04 343/702 |
| 2014/0086026 | A1* | 3/2014 | Mitani ................... | G04R 60/10 368/278 |

(Continued)

FOREIGN PATENT DOCUMENTS

| | | |
|---|---|---|
| JP | 2011-160055 A | 8/2011 |
| JP | 2012-093211 A | 5/2012 |

(Continued)

*Primary Examiner* — Edwin A. Leon
(74) *Attorney, Agent, or Firm* — Harness, Dickey & Pierce, P.L.C.

(57) ABSTRACT

An electronic timepiece has an antenna having a first conductor element connected to a feed, a second conductor element superimposed with the first conductor element in plan view, and a shorting element shorting the first and second conductor elements; a solar panel; a circuit board electrically connected to the feed; a connector electrically connecting the solar panel and the circuit board; and a case having a side wall and housing the antenna, solar panel, circuit board, feed, and connector. A through-hole through which a pivot passes is disposed to the antenna at a position different from the shorting element. The connector is disposed in plan view to a third area excluding from a first area surrounded by the side wall a second area defined by a line indicating a position one-third the distance from the center of the first or second conductor element to an outside circumference.

8 Claims, 9 Drawing Sheets

(56) References Cited

U.S. PATENT DOCUMENTS

| | | | |
|---|---|---|---|
| 2014/0232603 A1* | 8/2014 | Fujisawa | H01Q 1/24 343/702 |
| 2014/0240181 A1* | 8/2014 | Mamuro | H01Q 9/42 343/702 |
| 2018/0239308 A1 | 8/2018 | Yamamoto et al. | |
| 2019/0286069 A1 | 9/2019 | Yamamoto et al. | |
| 2019/0324407 A1 | 10/2019 | Sawada | |

FOREIGN PATENT DOCUMENTS

| | | |
|---|---|---|
| JP | 2012-093288 A | 5/2012 |
| JP | 2018-136296 A | 8/2018 |
| JP | 2019-163963 A | 9/2019 |

* cited by examiner

ELECTRONIC TIMEPIECE

CROSS REFERENCE TO RELATED APPLICATIONS

This application is based upon Japanese Patent Application No. 2018-153992 filed on Aug. 20, 2018, the entire contents of which are incorporated by reference herein.

BACKGROUND

1. Technical Field

The present invention relates to an electronic timepiece.

2. Related Art

Electronic timepieces having an antenna for receiving GPS satellite signals, and a solar panel, are known from the literature. For example, JP-A-2012-93288 describes a wristwatch having a planar patch antenna, a solar panel disposed on the face side of the patch antenna, and a circuit board disposed on the back cover side of the patch antenna. The patch antenna has a radiating conductor, a ground conductor, and a dielectric disposed therebetween. The solar panel has an electrode element electrically connected to the circuit board.

However, when a inverted-F antenna having a shorting element that shorts a radiating conductor and a ground conductor is used instead of a patch antenna, antenna gain may drop depending on the location of the electrode element relative to the shorting element of the inverted-F antenna.

SUMMARY

A first aspect of the invention of an electronic timepiece according to the invention has an antenna having a first conductor element connected to a feed, a second conductor element disposed superimposed with the first conductor element in plan view, and a shorting element that shorts the first conductor element and second conductor element; a solar panel; a circuit board electrically connected to the feed; a connector electrically connecting the solar panel and the circuit board; and a case having a side wall and housing the antenna, the solar panel, the circuit board, the feed, and the connector. A through-hole through which a pivot passes is disposed to the antenna at a position different from the shorting element. The connector is disposed in plan view to a third area excluding from a first area surrounded by the side wall a second area defined by an imaginary line indicating a position one-third the distance from the center of the first conductor element or the second conductor element to an outside circumference.

Other objects and attainments together with a fuller understanding of the invention will become apparent and appreciated by referring to the following description and claims taken in conjunction with the accompanying drawings.

DESCRIPTION OF EMBODIMENTS

Preferred embodiments of the invention are described below with reference to the accompanying figures. The dimensions and scale of parts shown in the figures differ from the actual dimensions and scale, and there are parts shown schematically for ease of understanding. The scope of the invention is also not limited to the following unless such limitation is expressly stated.

1. Embodiment 1

1-1. GPS Including an Electronic Timepiece

Figure 1:
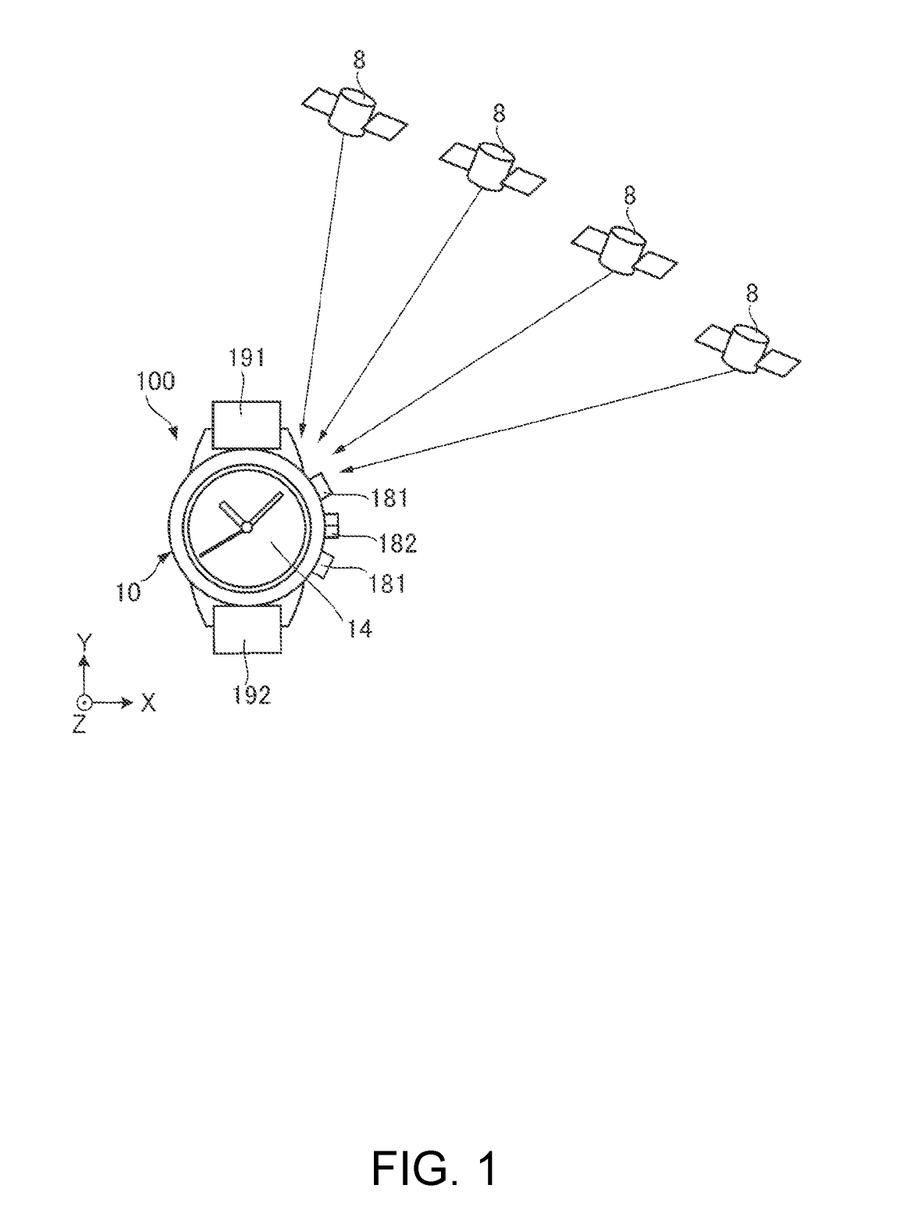
FIG. 1 illustrates the concept of a GPS system including an electronic timepiece that is an example of an electronic timepiece according to a first embodiment of the invention.

FIG. 1 illustrates the concept of a GPS system including an electronic timepiece that is an example of an electronic timepiece according to a first embodiment of the invention.

FIG. 1 illustrates the concept of a GPS system including an electronic timepiece according to the first embodiment of the invention. The electronic timepiece 100 shown in FIG. 1 is a wristwatch that receives wireless signals transmitted from at least one of multiple GPS satellites 8, and adjusts the internal time based on the received signals.

The GPS satellites 8 are positioning information satellites (navigation satellites) orbiting the Earth in space on known orbits, and transmit a navigation message superimposed on a 1.57542 GHz carrier wave to Earth. The 1.57542 GHz carrier wave on which the navigation message is superimposed is referred to below as a satellite signal. These satellite signals are right-hand circularly polarized waves.

Each GPS satellite 8 carries an atomic clock, and GPS time information, which is extremely precise time information kept by the atomic clock, is included in the satellite signals. The slight time difference of the atomic clock onboard each GPS satellite 8 is measured by a terrestrial control segment, and a time correction parameter for correcting this time difference is also included in the satellite signals. The electronic timepiece 100 receives satellite signals transmitted from one GPS satellite 8, and using the GPS time information and time correction parameter in the satellite signals adjusts the internal time to the correct time.

Orbit information indicating the position of the GPS satellite 8 on its orbit is also carried in the satellite signals. The electronic timepiece 100 can also calculate its location using the GPS time information and the orbit information. This navigation calculation supposes that there is a degree of difference in the internal time of the electronic timepiece 100. More specifically, in addition to the x, y, z parameters for determining the location of the electronic timepiece 100 in three-dimensional space, this time difference is an unknown value. As a result, the electronic timepiece 100 typically receives satellite signals transmitted from four or more GPS satellites 8, and uses the GPS time information and orbit information from each GPS satellite 8 to calculate the location.

1-2. Configuration of the Electronic Timepiece

For brevity, the following description references the three mutually perpendicular X-axis, Y-axis, and Z-axis shown in FIG. 1. In this description of the invention, the view from the Z-axis is referred to as a plan view. The surface of the electronic timepiece 100 that contacts the wrist of the user is referred to as the back side, and the opposite side is referred to as the face side. In addition, the direction from the back cover 12 to the crystal 14 is parallel to the Z-axis.

As shown in FIG. 1, the electronic timepiece 100 can be worn on the wrist of the user. The electronic timepiece 100 has a case 10, crystal 14, and a pair of bands 191 and 192. The pair of bands 191 and 192 are attachment members used to attach the case 10 to the user.

A crown 181, and multiple buttons 182, are also disposed to the case 10. The user can change the display on the electronic timepiece 100, for example, by operating the crown 181 and multiple buttons 182.

Note that the shape of the case 10 in plan view is round in FIG. 1, but the shape in plan view is not so limited and may be square or other polygonal shape.

Figure 2:
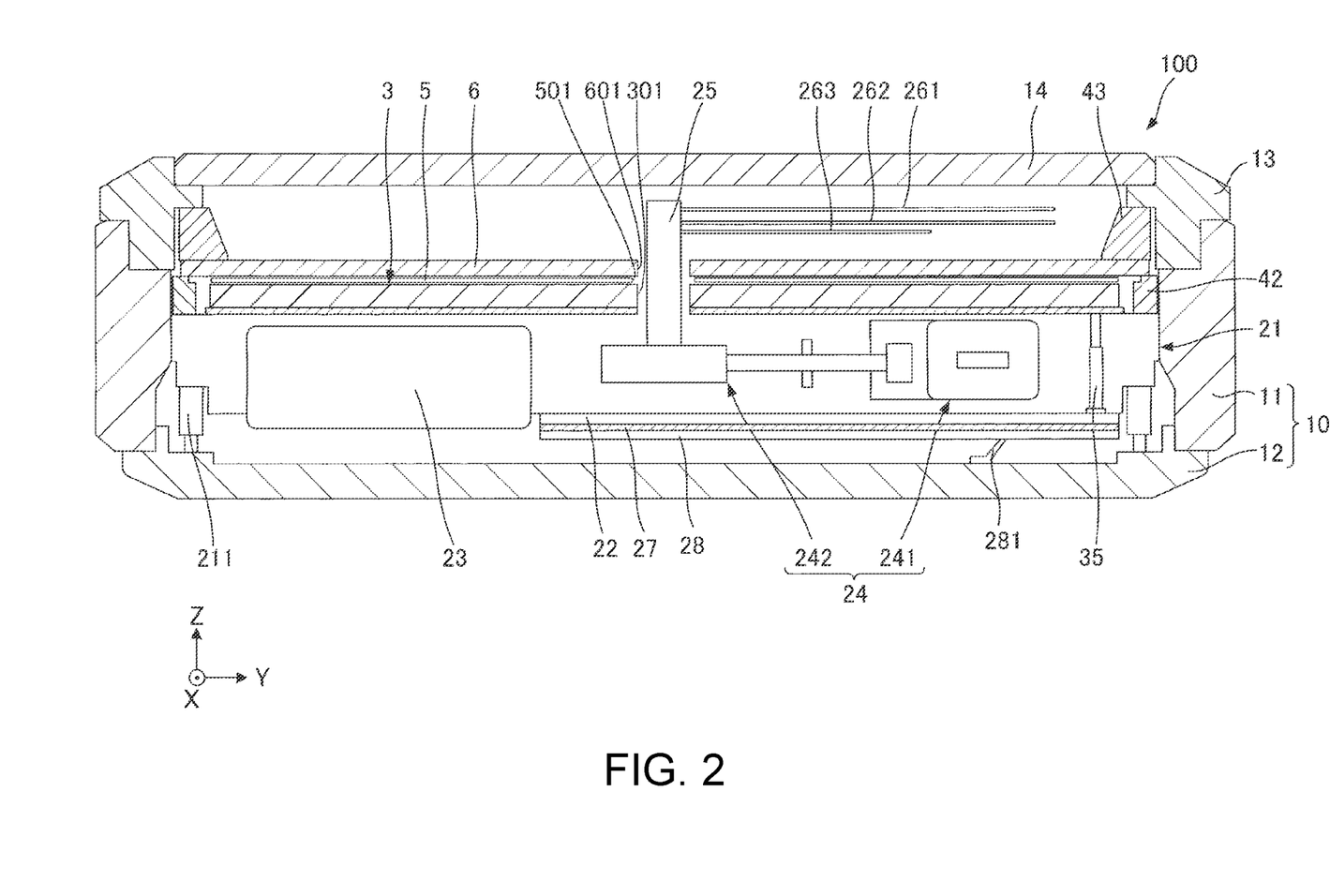
FIG. 2 is a section view of the electronic timepiece according to the first embodiment of the invention.

FIG. 2 is a section view of the electronic timepiece according to the first embodiment of the invention. As shown in FIG. 2, the electronic timepiece 100 has a main plate 21, a circuit board 22, a storage battery 23, a drive mechanism 24, a pivot 25, multiple hands 261, 262, and 263, an antenna 3, a solar panel 5, and a dial 6. These parts are disposed inside the case 10.

The case 10 includes a cylindrical case body 11 configuring the side wall of the case 10, and a back cover 12 that closes the opening of the case body 11 on the back cover side. The case body 11 and back cover 12 are discrete parts in this embodiment, but may be configured in unison. An annular bezel 13 is disposed on the face side of the case body 11. An optically transparent, flat crystal 14 is disposed inside the bezel 13.

The materials from which the case 10 and bezel 13 are made are not specifically limited, and may be a plastic material or a metal such as stainless steel. For example, by configuring the case 10 and bezel 13 with conductive materials, the inside of the case 10 can be shielded from external noise. By making the case 10 from metal, the electronic timepiece 100 can be given a high quality appearance.

The crystal 14 may be made from glass or various plastic materials.

The main plate 21 is pushed up and positioned in the Z-axis direction by a case ring 211. Multiple recesses for holding the storage battery 23 and drive mechanism 24 are formed in the main plate 21. Various plastic materials can be used to configure the main plate 21.

The storage battery 23 is charged by power produced by a solar panel 5 described below, and supplies power to the drive mechanism 24 and other parts. The storage battery 23 may be a lithium ion storage battery, for example.

The drive mechanism 24 includes a stepper motor 241 as the drive source, and a wheel train 242 as a power transfer mechanism that transfers drive power from the stepper motor 241 to the pivot 25. The pivot 25 is connected to the drive mechanism 24, and the pivot 25 can be driven rotationally by the drive mechanism 24.

The pivot 25 extends from the main plate 21 toward the crystal 14. Multiple hands 261, 262, 263 for indicating the time are attached to the pivot 25. The multiple hands 261, 262, 263 are located on the crystal 14 side of the dial 6, and rotate on the pivot 25.

A circuit board 22 is disposed on the back cover side of the main plate 21. The circuit board 22 controls driving parts of the electronic timepiece 100. The circuit board 22 includes a control circuit that controls driving the stepper motor 241, for example. This control circuit includes, for example, a CPU (Central Processing Unit), RAM (Random Access Memory), and a RTC (real time clock).

On the opposite side of the circuit board 22 as the main plate 21 is disposed a magnetic shield 27 that protects the drive mechanism 24 and circuit board 22 from external magnetic fields.

On the opposite side of the magnetic shield 27 as the circuit board 22 is disposed a circuit board holder 28 that supports the circuit board 22 and magnetic shield 27. The circuit board holder 28 is conductively connected to the back cover 12 by a conductive spring 281.

The antenna 3 is disposed on the face side of the main plate 21. The antenna 3 is a planar inverted-F antenna, and receives satellite signals. In the center of the antenna 3 in plan view is a through-hole 301 through which the pivot 25 passes. The antenna 3 is also disposed separated from the case body 11. The shorter the distance between the antenna 3 and the case body 11, the greater the current that flows to the case body 11 in the opposite direction as the current flowing to the antenna 3. As a result, radio waves reaching the antenna 3 are cancelled by the effect of the current, and the sensitivity of the antenna 3 drops. A drop in the sensitivity of the antenna 3 can therefore be suppressed by separating the antenna 3 and the case body 11.

A flat solar panel 5 is disposed on the face side of the antenna 3. The solar panel 5 converts light from the sun or other source to electrical energy. A through-hole 501 through which the pivot 25 passes is also formed in the center of the solar panel 5 in plan view.

The antenna 3 and solar panel 5 are described below in detail.

A flat dial 6 is disposed on the opposite side of the solar panel 5 as the antenna 3. The dial 6 is fastened by an annular fastening member 42 surrounding the antenna 3, and is separated from the solar panel 5.

A through-hole 601 through which the pivot passes 25 is also formed in the center of the dial 6 in plan view. Note that through-hole 601 is aligned with through-holes 301 and 501.

The dial 6 is an optically transparent insulator, and is made from a resin material such as polycarbonate.

An annular dial cover 43 is disposed on the face side of the dial 6 and covers the outside edge of the dial 6. The material used for the dial cover 43 is not specifically limited, and is preferably a resin material to suppress blocking the signals the antenna 3 receives.

The basic configuration of the electronic timepiece 100 is described above, and the electronic timepiece 100 may obviously have parts other than those described above.

1-3. Antenna and Solar Panel

Figure 3:
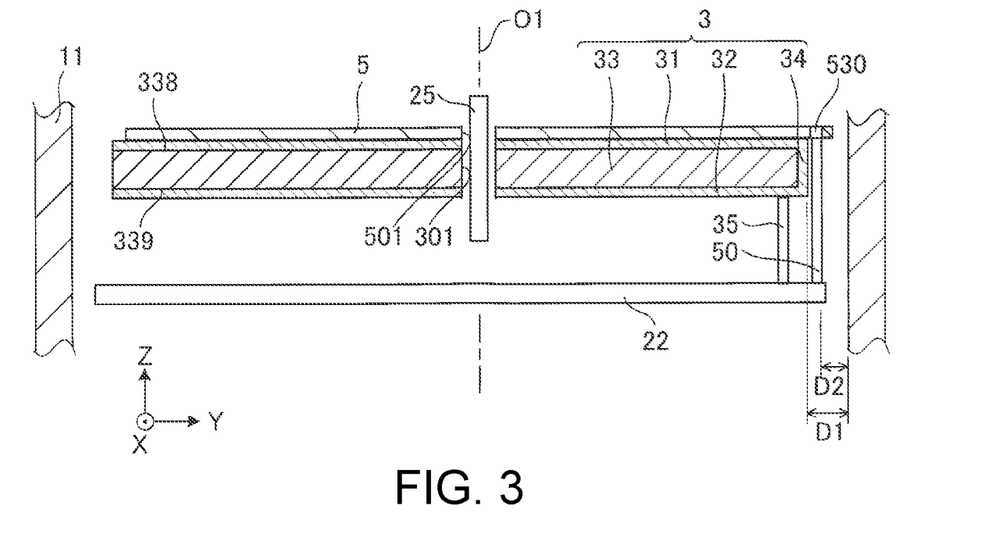
FIG. 3 is a section view of the antenna and solar panel in the first embodiment of the invention.
Figure 4:
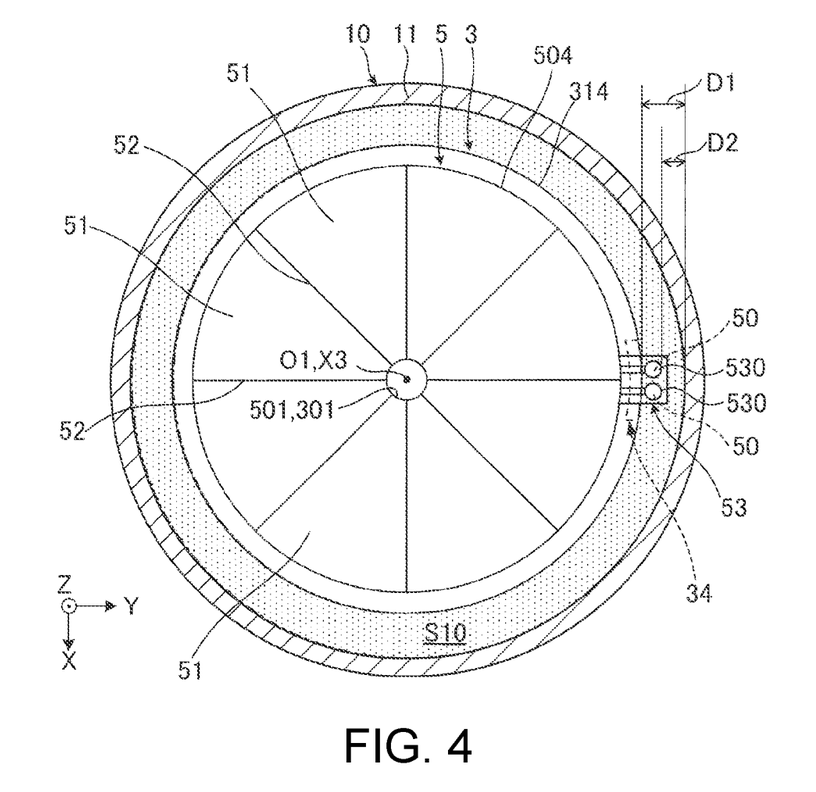
FIG. 4 is a plan view of the antenna and solar panel in the first embodiment of the invention.

FIG. 3 is a section view of the antenna and solar panel in the first embodiment of the invention. FIG. 4 is a plan view of the antenna and solar panel in the first embodiment of the invention. Note that the antenna 3, solar panel 5, and case body 11 are shown schematically for convenience.

1-3A. Antenna

As shown in FIG. 3, the antenna 3 comprises a first conductor element 31, a second conductor element 32, a substrate 33 that is a planar dielectric disposed between the first conductor element 31 and second conductor element 32, and a shorting element 34 disposed on the side of the substrate 33.

As shown in FIG. 4, the antenna 3 is round in plan view, but the shape in plan view is not specifically limited and may be a polygon. Part of the outside circumference may also be formed as a recess or protrusion.

In addition, the direction in which the first conductor element 31 and second conductor element 32 are stacked is parallel to the Z-axis.

The first conductor element 31, second conductor element 32, and shorting element 34 are an integrally formed part, and are disposed to outside surfaces of the substrate 33. The first conductor element 31, second conductor element 32, and shorting element 34 are conductive thin films formed on the substrate 33 by plating or vapor deposition. More specifically, the first conductor element 31, second conductor element 32, and shorting element 34 are metal films of copper, silver, or nickel, for example.

Note that the first conductor element 31, second conductor element 32, and shorting element 34 are an integrally formed part, but may be formed as discrete parts. These are also not limited to film configurations, and may be plate members.

The first conductor element 31 functions as a radiating electrode that determines the frequency of the antenna 3 and the polarization of the received radio waves. The first conductor element 31 is connected to a feed pin 35 as the conductive feed element, and is electrically connected to the circuit board 22 through the feed pin 35. The surface area of the first conductor element 31 is substantially the same as the surface area of the substrate 33, and the first conductor element 31 covers substantially all of one main side 338 of the substrate 33.

Note that the shape of the first conductor element 31 in plan view may be smaller or larger than the shape of the substrate 33 in plan view.

The second conductor element 32 functions as a ground electrode. The surface area of the second conductor element 32 is substantially the same as the surface area of the substrate 33, and the second conductor element 32 covers substantially all of the other main side 339 of the substrate 33. Note that the surface area of the second conductor element 32 may be smaller than the surface area of the substrate 33, but is preferably substantially the same as or larger than the surface area of the substrate 33 to suppress a drop in the sensitivity of the antenna 3.

The shorting element 34 connects and shorts the first conductor element 31 with the second conductor element 32. The shorting element 34 covers part of the side of the substrate 33. In this embodiment, the shorting element 34 is located on the positive Y-axis side of the substrate 33, that is, at the 12:00 position.

By the shorting element 34 being disposed to a position at 12:00, the directivity of right circular polarized waves of an antenna 3 that is an inverted-F antenna is biased approximately 60° to the 9:00 side from the center axis O1 through the thickness of the first conductor element 31. As a result, the directivity of right circular polarized waves of the antenna 3 is substantially vertical when the electronic timepiece 100 is worn on the left wrist and the user is walking. As a result, satellite signals can be easily received while the user is walking.

The shorting element 34 may also be disposed to a position other than 12:00. The shorting element 34 may be disposed at anyplace other than the through-hole 301 through which the pivot 25 passes, and may be disposed to a position other than the side of the substrate 33. For example, the shorting element 34 may be disposed through a hole not shown formed in the substrate 33.

The substrate 33 is an insulating member. The size of the antenna 3 can be reduced by the wavelength shortening effect of the substrate 33. The substrate 33 is preferably configured by a resin. Because a microstrip antenna resonates at $\lambda/2$, a ceramic or other material with a high dielectric constant is used to configure the substrate 33. However, because an inverted-F antenna resonates at $\lambda/$detector 4, even a resin with a low dielectric constant can be made to operate as an antenna 3.

In addition, if the substrate 33 is configured from a ceramic, the cost increases, and the substrate 33 cracks easily and is difficult to process. However, by configuring the substrate 33 from a resin, the cost is lower, resistance to cracking is greater, and processing is easier than when configuring the substrate 33 from a ceramic.

The substrate 33 is preferably configured from a resin with as low a dissipation factor as possible, and more specifically, the substrate 33 is preferably configured from a resin with a dissipation factor of approximately $1\times10^{-4}$. By using a resin with as low a dissipation factor as possible, a drop in the sensitivity of the antenna 3 can be suppressed. Examples of materials suitable for the substrate 33 include acrylic (PMMA), polycarbonate (PC), polypropylene (PP), polyvinyl chloride (PVC), acrylonitrile-butadiene-styrene copolymer (ABS resin) or other thermoplastic resins, phenol resin (PF), epoxy resin (EP), melamine resin (MF), polyurethane resin (PUR), silicon resins (SI) or other thermoset resins.

1-3C. Solar Panel

The solar panel 5 is planar, and is held by the antenna 3. The solar panel 5 is bonded to the first conductor element 31 by a double-sided adhesive sheet, for example. Note that the solar panel 5 may disposed separated from the antenna 3 by being supported by a different part not shown instead of the antenna 3.

The solar panel 5 has multiple solar cells 51 separated by multiple divider lines 52 extending in a radiating pattern from the through-hole 501 to the outside edge 504. These multiple solar cells 51 are connected in series. Note that while the number of solar cells 51 is eight in the figure, the number is not limited to eight and there may be more or less.

The solar cells 51 are formed by layering in order from the first conductor element 31 side a resin substrate, a metal electrode, a semiconductor layer, a transparent electrode, and a protective layer. The semiconductor layer is formed with an i-type semiconductor between a p-type semiconductor and an n-type semiconductor. Note that the configuration of the solar cells 51 is not limited to this configuration.

The plane area of the solar panel 5 is the same as the plane area of the antenna 3 or less than the plane area of the antenna 3, and the solar panel 5 is covered by the antenna 3 in plan view. In this configuration the outside circumference 314 of the first conductor element 31 of the antenna 3 functions as a radiator that radiates particularly strong radio waves. As a result, by disposing the outside circumference 314 of the first conductor element 31 on the outside of the solar panel 5 in plan view, the effect of the solar panel 5 on the antenna 3 can be reduced, and loss in the reception or transmission performance of the antenna 3 can be suppressed.

The solar panel 5 has a protruding part 53 that protrudes to the outside. The protruding part 53 is formed by a resin substrate and protective layer, for example. Two terminals 530 are also disposed to the protruding part 53. One of the two terminals 530 is a positive terminal, and the other is a negative terminal. The two terminals 530 are each connected to a connector 50, which is an electrode connected to the circuit board 22. The negative terminal of the two terminals 530 is connected to a reference potential. The terminals 530 and connectors 50 are located in plan view outside of the antenna 3.

The connectors 50 are disposed in plan view to an area S10 between the antenna 3 and the case body 11. For clarity, the area S10 is shaded by a dotted pattern in FIG. 4. The distance D2 between the connectors 50 and the case body 11 is shorter than the distance D1 between the shorting element 34 and the case body 11. In this embodiment the connectors 50 are also disposed to a position corresponding to 12:00, and the connectors 50 and shorting element 34 are superimposed with each other when seen from the Y-axis. The connectors 50 and shorting element 34 do not need to be superimposed.

1-4. Connector Location

A drop in antenna 3 gain can be suppressed by desirably setting the position of the connectors 50 relative to the shorting element 34 of the antenna 3. Suppressing a drop in antenna 3 gain due to the location of the connectors 50 is described below with reference to the results of two simulations.

Note that the reference numerals for parts of electronic timepiece 100x shown in FIG. 6 and FIG. 8 used in the following description of the simulations have the index 'x' appended to the reference numerals of the corresponding parts of the electronic timepiece 100 according to this embodiment of the invention. Because the configuration of the electronic timepiece 100x is substantially the same as the configuration of the electronic timepiece 100 described above, further description thereof is omitted. However, the simulations described below relate to the location of one representative connector 50x.

1-4A. First Simulation

Figure 5:
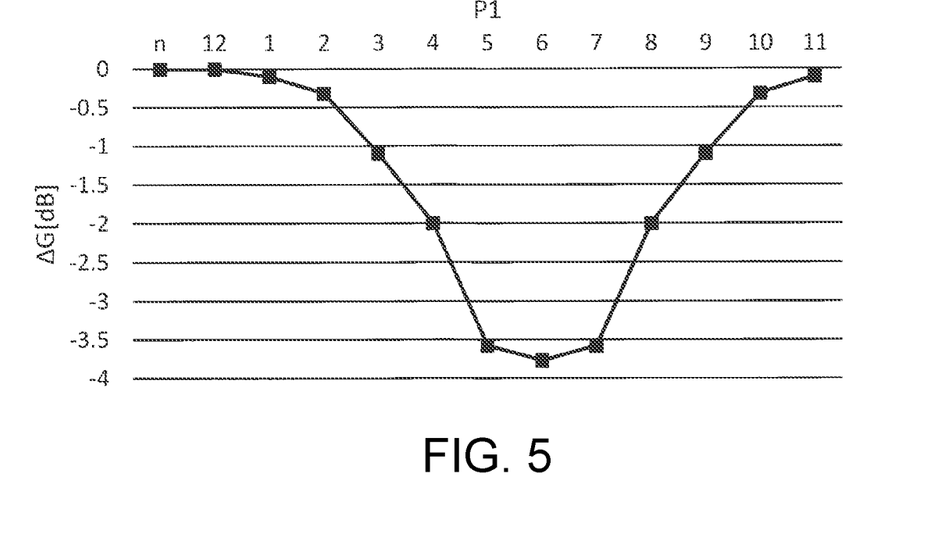
FIG. 5 is a graph showing the relationship between the location of the connector and antenna gain.

FIG. 5 is a graph showing the relationship between the location of the connector and antenna gain, and shows the results of a first simulation. FIG. 6 illustrates the location of the connector in the first simulation.

Figure 6:
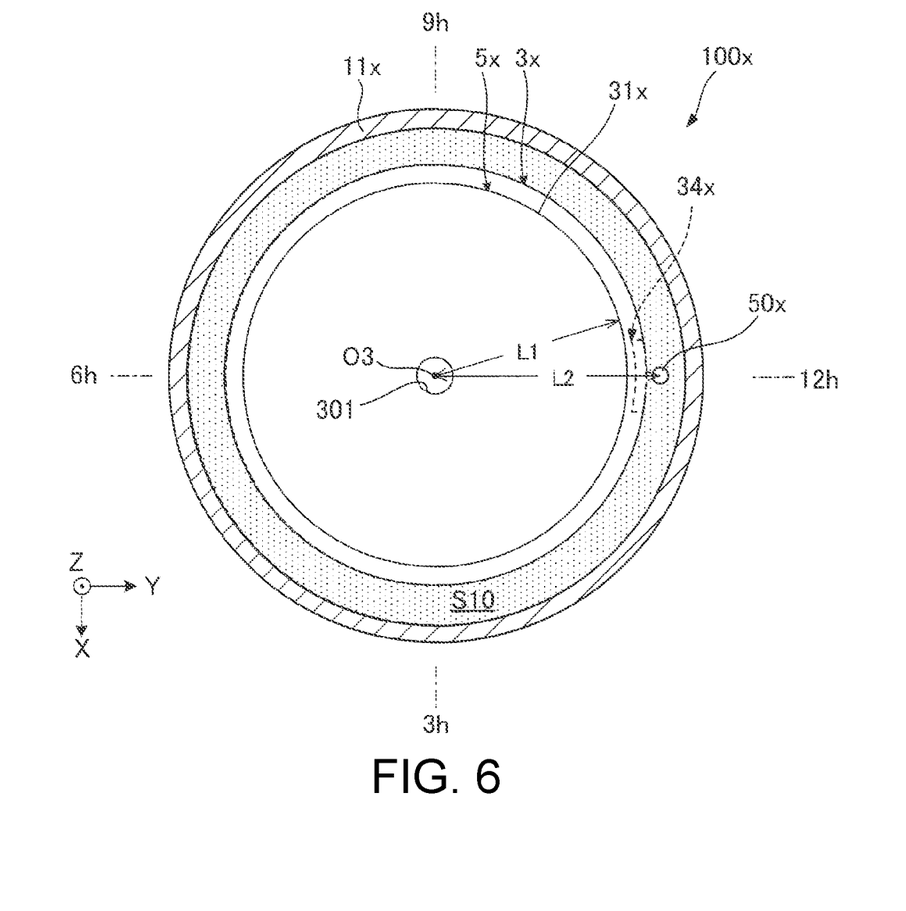
FIG. 6 illustrates the location of the connector.

The graph in FIG. 5 shows the difference in the gain of the antenna 3x between when the solar panel 5x and connector 50x shown in FIG. 6 are not present, and when the solar panel 5x is disposed on the antenna 3x and the connector 50x moves clockwise from the 12:00 position in one hour increments. In FIG. 5 "n" indicates the state without the solar panel 5x and connector 50x.

The Y-axis in the graph in FIG. 5 indicates the gain ΔG (dB) of the antenna 3x. As shown in the graph in FIG. 5, the gain when a solar panel 5x is not present is 0 dB. The X-axis in the graph in FIG. 5 indicates the position P1 of the 50x.

For example, "12" in FIG. 5 indicates a position corresponding to 12:00, and "1" indicates a position corresponding to 1:00.

Note that as shown in FIG. 6 the shorting element 34x is located at a position corresponding to 12:00. The connector 50x is shifted rotationally in one hour increments along the outside circumference of the antenna 3x inside area S10x when seen in plan view.

The radius L1 of the round first conductor element 31x is 14 mm, and the distance L2 between the center X3 of the first conductor element 31x and the connector 50x is 14.5 mm.

As will be understood from the results of the first simulation shown in FIG. 5, when the shorting element 34x is disposed to a location corresponding to 12:00, the effect of the connector 50x on the gain of the antenna 3x can be suppressed to 3.5 dB or less by disposing the connector 50x at a location other than 5:00, 6:00, or 7:00. The effect of the connector 50x on the gain of the antenna 3x can also be suppressed to 1.0 dB or less by disposing the connector 50x at a 9:00, 10:00, 11:00, 12:00, 1:00, 2:00, or 3:00 position. The effect of the connector 50x on the gain of the antenna 3x can be suppressed the most by disposing the connector 50x at the 12:00 position.

Therefore, the connectors 50 and shorting element 34 are both disposed to a 12:00 position in this embodiment of the invention. As will be understood from the results of the first simulation, this location can best suppress a drop in the performance of the antenna 3 due to the effect of the connector 50.

Note that if the connectors 50 are disposed to a 4:00 position, the drop in the performance of the antenna 3 due to the effect of the connectors 50 can be best suppressed by also disposing the shorting element 34 to the 4:00 position.

1-4B. Second Simulation

Figure 7:
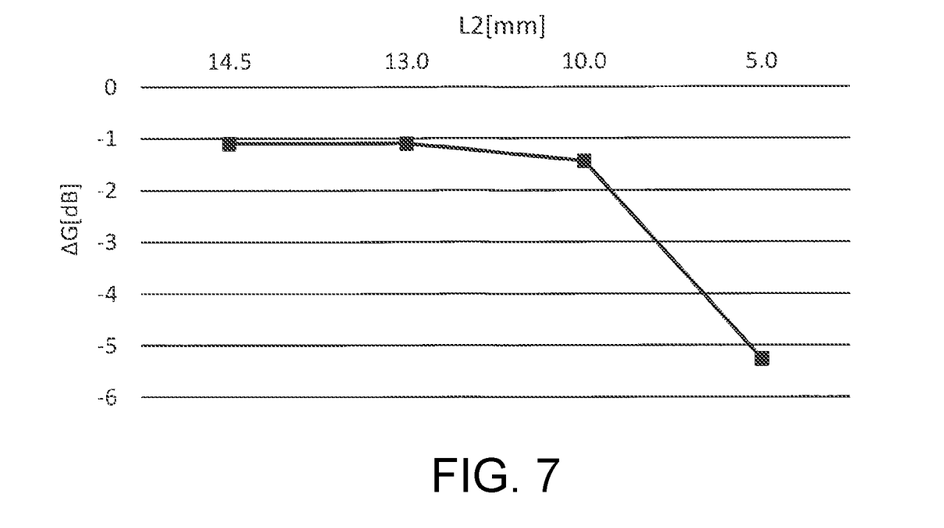
FIG. 7 is a graph showing the relationship between the location of the connector and antenna gain.

FIG. 7 is a graph showing the relationship between the location of the connector and antenna gain, and shows the results of a second simulation. FIG. 8 illustrates the location of the connector in the second simulation.

Figure 8:
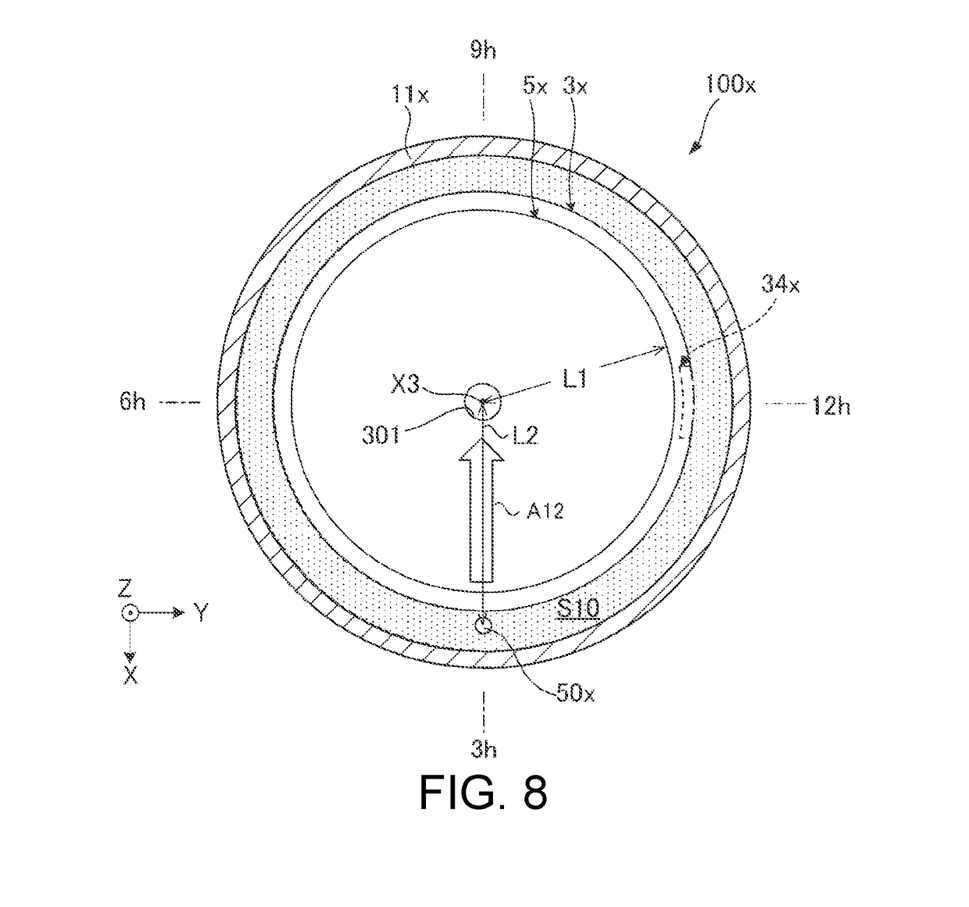
FIG. 8 illustrates the location of the connector.

The graph in FIG. 7 shows the difference in the gain of the antenna 3x between when the connector 50x is disposed to a position corresponding to 3:00 as shown in FIG. 8, and when the connector 50x moves in the direction of arrow A12 from the position corresponding to 3:00 and a position corresponding to 9:00.

The Y-axis in the graph in FIG. 7 indicates the gain ΔG (dB) of the antenna 3x. In the graph in FIG. 7 the gain when a solar panel 5x and connector 50x are not present is 0 dB. The X-axis in the graph in FIG. 7 indicates the distance L2 in millimeters between the connector 50x and the center X3.

Note that the shorting element 34x is disposed to a position corresponding to 12:00. In addition, the radius L1 of the first conductor element 31x is 14 mm, and the distance L2 between the connector 50x located at the position shown in FIG. 8 and the center X3 is 14.5 mm. The distance L2 was changed and difference (dB) in gain when distance L2 was 14.5 mm, 13.0 mm, 10.0 mm, and 5.0 mm was calculated. For example, 13.0 on the X-axis in FIG. 7 indicates a distance L2 of 13.0 mm.

As shown in FIG. 7, when distance L2 is 5.0 mm, the effect of the connector 50x on the gain of the antenna 3x increases. As a result, the connector 50x is preferably disposed to a position greater than or equal to 5.0 mm. Therefore, by locating the connector 50x outside of an imaginary circle having a radius of ⅓ the radius L1 in plan view, the effect of the connector 50x on the gain of the antenna 3x can conceivably be reduced. In addition, if distance L2 is 10.0 mm, the effect of the connector 50x on the gain of the antenna 3x can be greatly reduced.

As a result, by locating the connector 50x outside of an imaginary circle having a radius of ⅔ the radius L1 in plan view, the effect of the connector 50x on the gain of the antenna 3x can conceivably be greatly reduced.

Furthermore, as shown in FIG. 7, if the distance L2 is 13.0 mm or more, the effect of the connector 50x on the gain of the antenna 3x is particularly small. As a result, the effect of the connector 50x on the gain of the antenna 3x can be made particularly small by locating the connector 50x at a location superimposed with the outside edge of the antenna 3x, or outside of the antenna 3x, in plan view.

Figure 9:
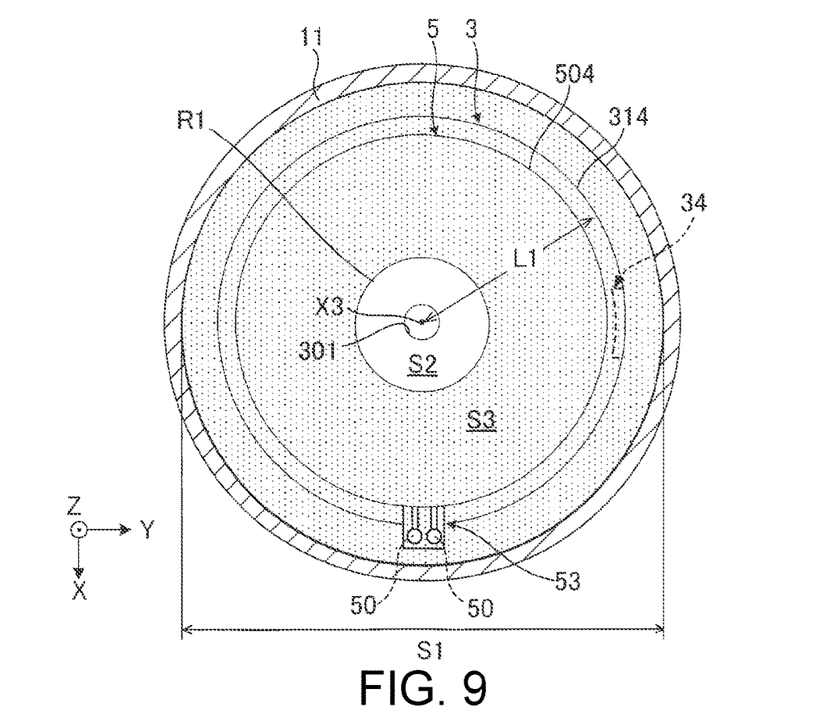
FIG. 9 is a plan view of a third area in the first embodiment.

FIG. 9 is a plan view showing a third area in the first embodiment of the invention. As will be understood from the results of the second simulation, the connectors 50 are preferably disposed in the third area S3 indicated by the dotted shading in FIG. 9.

In plan view, the third area S3 is the area inside the first area S1 enclosed by the case body 11 excluding a second area S2, which is enclosed in the figure by an imaginary line R1 indicating the position ⅓ of the distance from the center X3 of the first conductor element 31 to outside circumference 314.

In this embodiment of the invention imaginary line R1 is a circle having a radius ⅓ of radius L1. Note that the third area S3 is indicated by a dotted pattern in FIG. 9.

The antenna 3 in this example is an inverted-F antenna having a first conductor element 31, second conductor element 32, and shorting element 34, and has a through-hole 301 at a position different from the shorting element 34. This enables increasing the length of the current path of the antenna 3, and results in a small inverted-F antenna with excellent sensitivity.

By disposing the connectors 50 in this third area S3 in an electronic timepiece 100 having such an inverted-F antenna as the antenna 3, the effect of the connectors 50 on the gain of the antenna 3 can be reduced regardless of the location of the shorting element 34 when compared with a configuration having the connectors 50 disposed in an area other than the third area S3. As a result, a drop in the performance of the antenna 3 can be suppressed in an electronic timepiece 100 having a solar panel 5 and antenna 3.

This embodiment of the invention has two connectors 50, and the two connectors 50 are in the third area S3. Because all connectors 50 are inside the third area S3, the effect of the connectors 50 on the gain of the antenna 3 can be suppressed regardless of the location of the shorting element 34.

Note that the second area S2 in this example is an area enclosed by an imaginary line R1 indicating the position ⅓ of the radius L1 from the center X3 of the first conductor element 31 to the outside circumference 314, but the second area may be an area enclosed by an imaginary line indicating the position ⅓ of the distance from the center of the second conductor element 32 to its outside circumference.

Note also that the first conductor element is not limited to being round in plan view, in which case the center is the center of an imaginary circle with the largest radius of any imaginary circle touching the outside circumference of the first conductor element. This also applies to the second conductor element.

Note that while not shown in detail in the figures, the connectors 50 are preferably in an area excluding from the first area S1 an area surrounded by an imaginary line indicating the position ⅔ of the distance from the center X3 of the first conductor element 31 to the outside circumference 314. This configuration further reduces the effect of the connector 50x on the gain of the antenna 3x.

In this embodiment of the invention the connectors 50 are located between the antenna 3 and case body 11 in plan view. More specifically, the connectors 50 are disposed in area S10. By disposing the connectors 50 in area S10, the effect of the connectors 50 on the gain of the antenna 3 can be particularly minimized as will be understood from the results of the second simulation.

Yet further, in this embodiment the connectors 50 are disposed in plan view in area S10 and between the shorting element 34 and the case body 11. As also shown in the figure, the through-hole 301, shorting element 34, and connectors 50 are sequentially aligned in the Y-axis direction perpendicular to the Z-axis. By disposing the connectors 50 in this position, the effect of the connectors 50 on the gain of the antenna 3 can be particularly minimized as will be understood from the results of the first and second simulations.

As also described above, the antenna 3 is disposed between the solar panel 5 and the circuit board 22. More specifically, the antenna 3 is disposed on the back cover side of the solar panel 5.

When the antenna 3 is located on the back cover side of the solar panel 5, the solar panel 5 is contained within the antenna 3 in plan view, and a drop in the performance of the antenna 3 can be particularly suppressed by disposing the connectors 50 in the third area S3 in plan view.

In addition, because the connectors 50 can be located outside of the antenna 3 by disposing the connectors 50 in area S10 when the antenna 3 is disposed between the solar panel 5 and circuit board 22, there is no need to provide a through-hole in the antenna 3 to pass the connectors 50. As a result, desirably arranging the connectors 50, antenna 3, and solar panel 5 is simple.

The connectors 50 and shorting element 34 are superimposed with each other when seen from the Y-axis direction perpendicular to the Z-axis. When the connectors 50 and shorting element 34 are superimposed with each other when seen from a direction perpendicular to the Z-axis, the connectors 50 affect the gain of the antenna 3 depending on the location of the connectors 50. As a result, when the connectors 50 and shorting element 34 are superimposed with each other when seen from a direction perpendicular to the Z-axis, the effect of the connectors 50 on the gain of the antenna 3 can be reduced by disposing the connectors 50 in the third area S3.

Note that the connectors 50 and shorting element 34 may be superimposed with each other when seen from a direction perpendicular to the Z-axis, that is, in a side view. The locations of the antenna 3 and solar panel 5 are also not limited to those shown in the figures.

In this example the connectors 50 and shorting element 34 are not superimposed with each other when seen from a direction perpendicular to the Z-axis, but they may be superimposed in this view.

The antenna 3 may also be configured without a substrate 33.

The solar panel 5 may also be disposed between the first conductor element 31 and second conductor element 32. In this case, the first conductor element 31 is a transparent electrode configured by a transparent electrode material.

The circuit board 22 may also be disposed between the first conductor element 31 and second conductor element 32.

2. Embodiment 2

Figure 10:
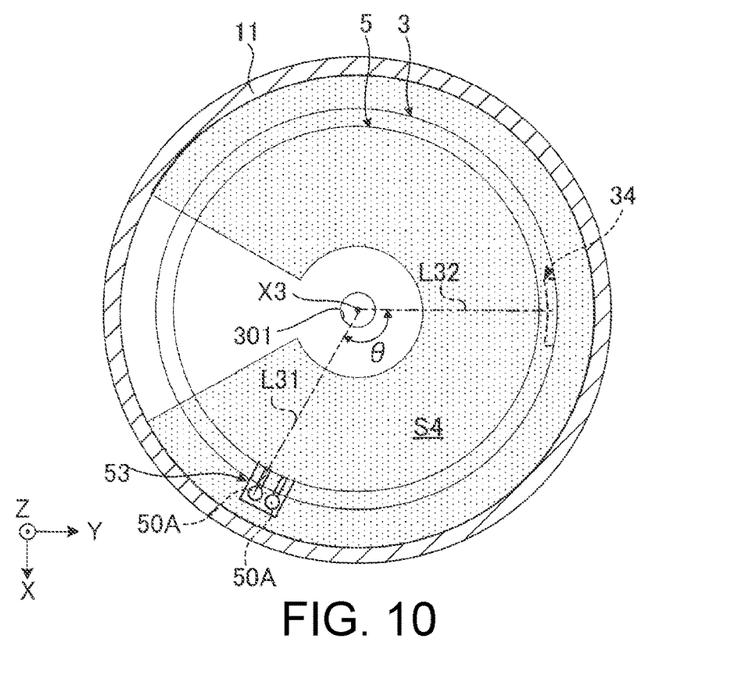
FIG. 10 is a plan view showing the location of the connector in a second embodiment of the invention.

A second embodiment of the invention is described below. FIG. 10 is a plan view showing the location of the connector in a second embodiment of the invention.

This embodiment differs from the first embodiment primarily in the location of the connector. The following description focuses on the differences between the second embodiment and the first embodiment, and further description of like elements is omitted or abbreviated. Note also that like parts in the second embodiment and the first embodiment are identified by like reference numerals in FIG. 10. Below, the counterclockwise direction around the shorting element 34 in plan view is indicated by "−", and the clockwise direction is indicated by "+".

As shown in FIG. 10, the connectors 50A are disposed to a position corresponding to 4:00 in plan view. Also in plan view, the connectors 50A are disposed in third area S3 at a location within a range where the angle θ formed by a first line segment L31 from center X3 through the connector 50A, and a second line segment L32 from center X3 through the shorting element 34, is greater than or equal to 0° and less than or equal to 150°. In other words, the connectors 50A are disposed in area S4 that satisfies a range of +/−150° centered on the shorting element 34 in plan view. This area S4 is identified by dotted shading in FIG. 10.

By disposing the connectors 50A in area S4, the effect of the connectors 50A on the gain of the antenna 3 can be reduced compared with a configuration in which the connectors 50A are located outside the area S4, as will be understood from the results of the first simulation.

In this example the two connectors 50A are in area S4. Because all connectors 50A are inside the area S4, the effect of the connectors 50A on the gain of the antenna 3 can be suppressed as described above. By disposing all connectors 50A in area S4, the effect of the connectors 50A on the gain of the antenna 3 can be reduced.

Note that first line segment L31 is a line passing through the center of the connector 50A, and second line segment L32 is a line passing through the center of the shorting element 34. When there are multiple connectors 50A and shorting elements 34, the angle θ formed by the first line segment L31 passing through each connector 50A, and the second line segment L32 passing through each shorting element 34, preferably satisfies the relationship described above. This also applies to the third and fourth embodiments described below.

3. Embodiment 3

Figure 11:
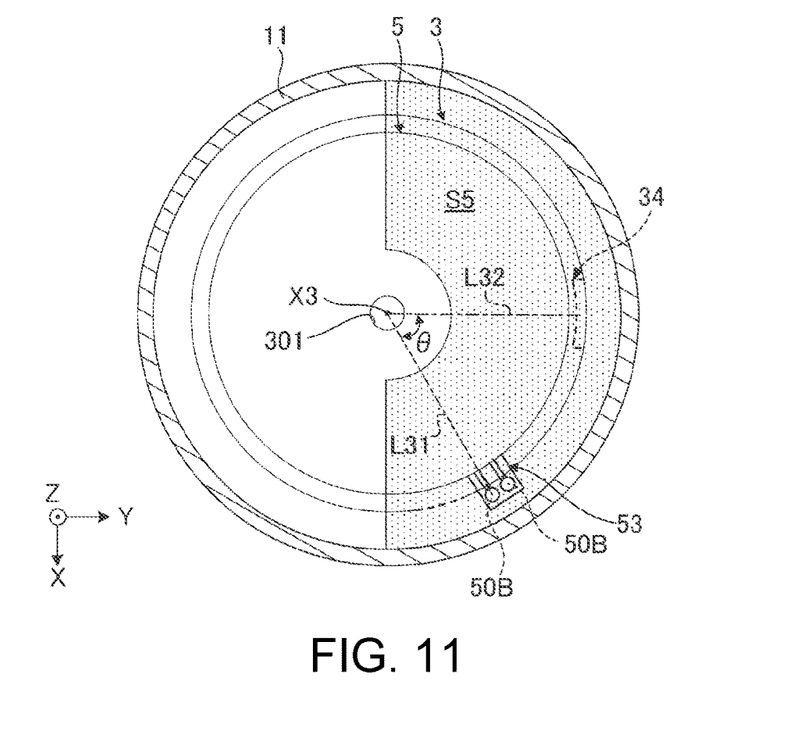
FIG. 11 is a plan view showing the location of the connector in a third embodiment of the invention.

A third embodiment of the invention is described below. FIG. 11 is a plan view showing the location of the connector in the third embodiment of the invention.

This embodiment differs from the first embodiment primarily in the location of the connector. The following description focuses on the differences between the third embodiment and the first embodiment, and further description of like elements is omitted or abbreviated. Note also that like parts in the third embodiment and the first embodiment are identified by like reference numerals in FIG. 11. Below, the counterclockwise direction around the shorting element 34 in plan view is indicated by "−", and the clockwise direction is indicated by "+".

As shown in FIG. 11, the connectors 50B are disposed to a position corresponding to 2:00 in plan view. Also in plan view, the connectors 50B are disposed in third area S3 at a location within a range where the angle θ formed by a first line segment L31 from center X3 through the connector 50B, and a second line segment L32 from center X3 through the shorting element 34, is greater than or equal to 0° and less than or equal to 90°. In other words, the connectors 50B are disposed in area S5 that satisfies a range of +/−90° centered on the shorting element 34 in plan view. This area S5 is identified by dotted shading in FIG. 11.

By disposing the connectors 50B in area S5, the effect of the connectors 50B on the gain of the antenna 3 can be reduced compared with a configuration in which the connectors 50B are located outside the area S5, as will be understood from the results of the first simulation.

In this example the two connectors 50B are in area S5. By disposing all connectors 50B in area S5, the effect of the connectors 50B on the gain of the antenna 3 can be reduced.

4. Embodiment 4

Figure 12:
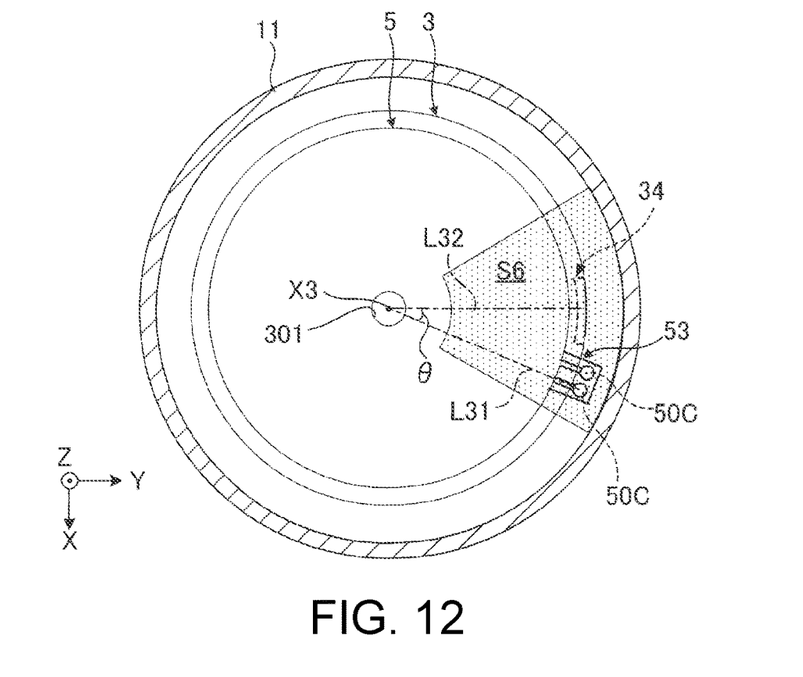
FIG. 12 is a plan view showing the location of the connector in a fourth embodiment of the invention.

A fourth embodiment of the invention is described below. FIG. 12 is a plan view showing the location of the connector in the fourth embodiment of the invention.

This embodiment differs from the first embodiment primarily in the location of the connector. The following description focuses on the differences between the fourth embodiment and the first embodiment, and further description of like elements is omitted or abbreviated. Note also that like parts in the fourth embodiment and the first embodiment are identified by like reference numerals in FIG. 12. Below, the counterclockwise direction around the shorting element 34 in plan view is indicated by "−", and the clockwise direction is indicated by "+".

As shown in FIG. 12, the connectors 50C are disposed to a position between 12:00 and 1:00 in plan view. Also in plan view, the connectors 50C are disposed in third area S3 at a location within a range where the angle θ formed by a first line segment L31 from center X3 through the connector 50C, and a second line segment L32 from center X3 through the shorting element 34, is greater than or equal to 0° and less than or equal to 30°. In other words, the connectors 50C are disposed in area S6 that satisfies a range of +/−30° centered on the shorting element 34 in plan view. This area S6 is identified by dotted shading in FIG. 12.

By disposing the connectors 50C in area S6, the effect of the connectors 50C on the gain of the antenna 3 can be reduced compared with a configuration in which the connectors 50C are located outside the area S6, as will be understood from the results of the first simulation.

In this example the two connectors 50C are in area S6. By disposing all connectors 50C in area S6, the effect of the connectors 50C on the gain of the antenna 3 can be reduced.

5. Embodiment 5

Figure 13:
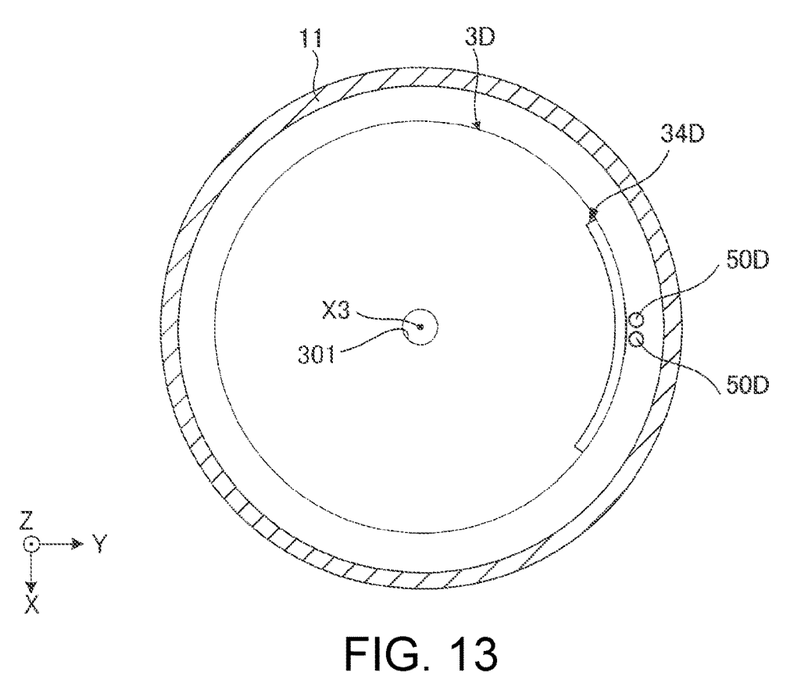
FIG. 13 is a plan view illustrating the location of the shorting element and connector in a fifth embodiment of the invention.

A fifth embodiment of the invention is described below. FIG. 13 is a plan view illustrating the location of the shorting element and connector in the fifth embodiment of the invention.

This embodiment differs from the first embodiment primarily in the configuration of the shorting element. The following description focuses on the differences between the fifth embodiment and the first embodiment, and further description of like elements is omitted or abbreviated. Note also that like parts in the fifth embodiment and the first embodiment are identified by like reference numerals in FIG. 13.

As shown in FIG. 13, in this embodiment, the length of the shorting element 34D in the circumferential direction of the antenna 3D is longer than the shorting element 34 in the first embodiment. As in the first embodiment, in this embodiment the connectors 50D are located at a position in plan view that is between the antenna 3D and case body 11, and is between the ends of the shorting element 34D in the circumferential direction of the antenna 3D and between the shorting element 34D and the case body 11.

Also in plan view, the through-hole 301, shorting element 34D, and connectors 50D are aligned sequentially on the Y-axis perpendicular to the Z-axis.

By disposing the connectors 50D to the positions described above, the effect of the connectors 50D on the gain of the antenna 3 can be reduced. Note that considering the effect of the connectors 50D on the gain of the antenna 3, the length of the antenna 3D of the shorting element 34D in the circumferential direction is preferably ½ or less of the length of the antenna 3D in the circumferential direction.

6. Embodiment 6

Figure 14:
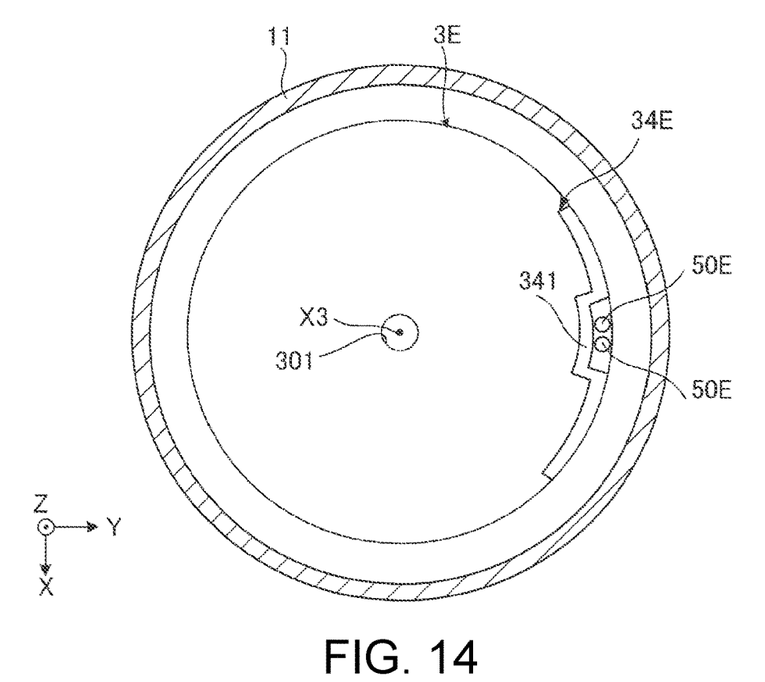
FIG. 14 is a plan view illustrating the location of the shorting element and connector in a sixth embodiment of the invention.

A sixth embodiment of the invention is described below. FIG. 14 is a plan view showing the location of the shorting element and the connectors in the sixth embodiment of the invention.

This embodiment differs from the first embodiment primarily in the configuration of the shorting element. The following description focuses on the differences between the sixth embodiment and the first embodiment, and further description of like elements is omitted or abbreviated. Note also that like parts in the sixth embodiment and the first embodiment are identified by like reference numerals in FIG. 14.

As shown in FIG. 14, in this embodiment, the length of the shorting element 34E in the circumferential direction of the antenna 3E is longer than the shorting element 34 in the first embodiment.

The shorting element 34E has in the middle thereof in plan view a protrusion 341 toward the center X3. As in the first embodiment, the connectors 50E in this embodiment are located at a position in plan view that is between the antenna 3E and case body 11, and is between the ends of the shorting element 34E in the circumferential direction of the antenna 3D and between the shorting element 34E and the case body 11.

Also in plan view, the through-hole 301, shorting element 34E, and connectors 50E are aligned sequentially on the Y-axis perpendicular to the Z-axis.

Even when the shorting element 34E has a protrusion 341, the effect of the connectors 50E on the gain of the antenna 3E can be made particularly small by disposing the connectors 50E as described above. Furthermore, by disposing connectors 50E on a protrusion 341 as described above, the diameter of the movement can be reduced.

7. Embodiment 7

Figure 15:
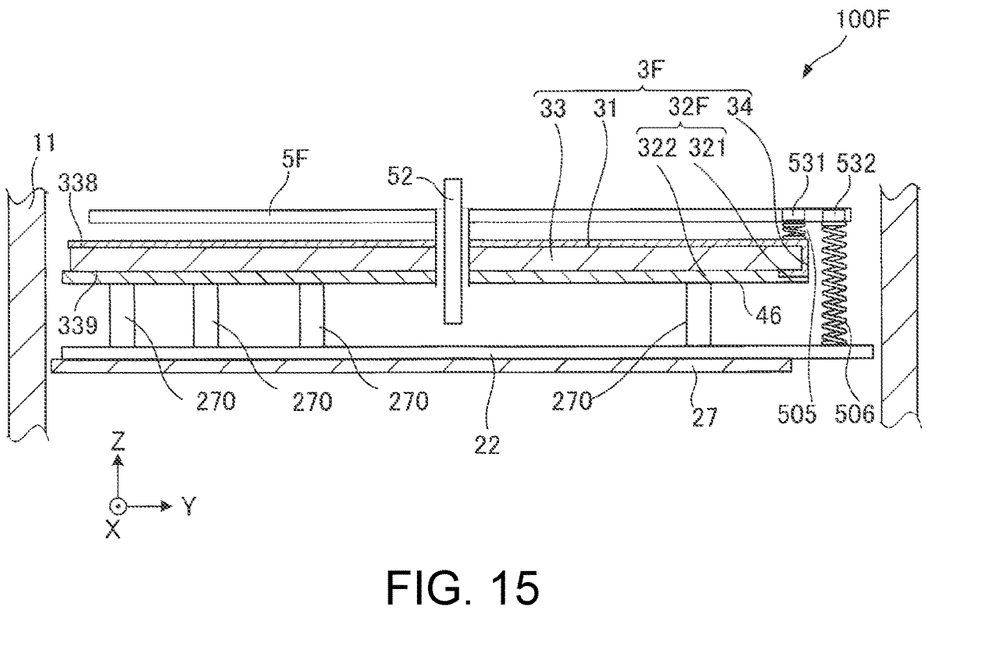
FIG. 15 is a section view of the shorting element in a seventh embodiment of the invention.
Figure 16:
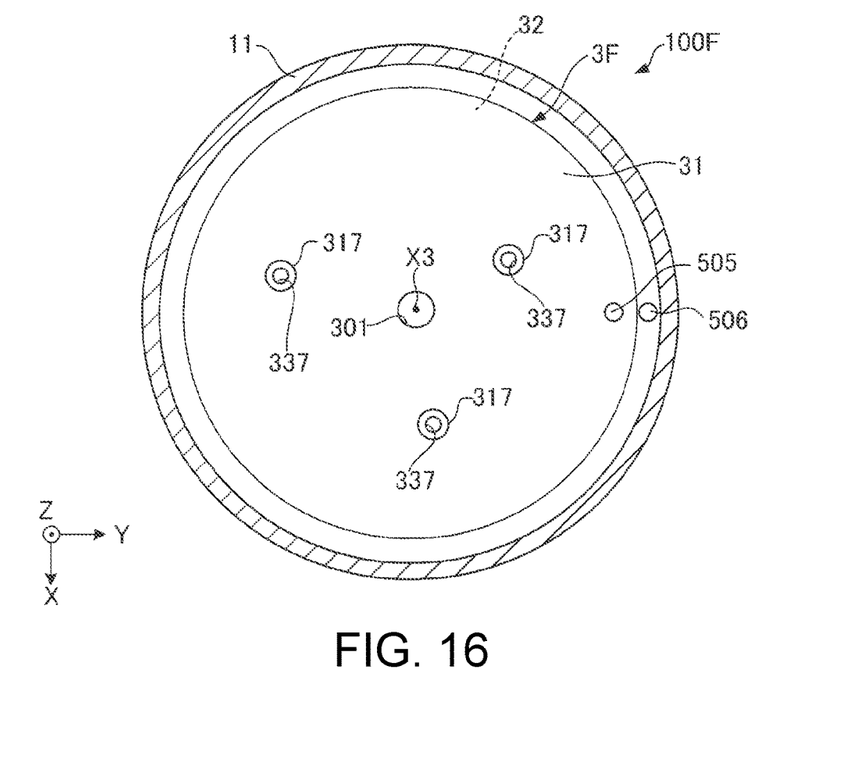
FIG. 16 is a plan view of the antenna in a seventh embodiment of the invention.

A seventh embodiment of the invention is described next. FIG. 15 is a section view of the shorting element in a seventh embodiment of the invention. FIG. 16 is a plan view showing the antenna in the seventh embodiment of the invention.

This embodiment differs from the first embodiment primarily in the configuration of the antenna and connector. The following description focuses on the differences between the seventh embodiment and the first embodiment, and further description of like elements is omitted or abbreviated. Note also that like parts in the seventh embodiment and the first embodiment are identified by like reference numerals in FIG. 15 and FIG. 16.

As shown in FIG. 15, second conductor element 32F of the antenna 3F the electronic timepiece 100F according to this embodiment has a first member 321 and a second member 322.

The first member 321 is formed integrally with the first conductor element 31 and shorting element 34. The first member 321, first conductor element 31, and shorting element 34 are conductive thin films formed on the substrate 33 by plating or vapor deposition. The shape of the first member 321 in plan view is smaller than the shape of the substrate 33 in plan view, and the first member 321 covers part of a main side 339 of the substrate 33.

The second member 322 functions as a magnetic shield. The second member 322 is a flat, conductive sheet of pure iron or ferritic stainless steel, for example, coated with a metal layer of copper, gold, or nickel, for example. The surface area of the second member 322 is substantially the same as the surface area of the substrate 33, and the second member 322 is superimposed with the substrate 33 in plan view.

Multiple conductive members 270 configured by metal screws, for example, are connected to the second member 322, and the second member 322 is conductive to the magnetic shield 27 for antistatic protection.

Note that the surface area of the second member 322 may be smaller or larger than the surface area of the substrate 33, but is preferably substantially the same as or larger than the area of the substrate 33 to suppress a drop in the sensitivity of the antenna 3F.

As also shown in FIG. 16, multiple screw holes 327 used to affix the antenna 3 to the main plate 21 are formed in the second member 322. The first conductor element 31, second conductor element 32F, and substrate 33 are affixed by screws to the main plate 21 from the dial 6 side. The second member 322 also contacts the first member 321 and is conductive to the first member 321. The multiple holes 317 are formed in the first conductor element 31 at locations corresponding to the screw holes 337 to prevent contact between the screws used for fastening and the first conductor element 31.

A negative terminal 531 and a positive terminal 532 are disposed to the solar panel 5F shown in FIG. 16. The negative terminal 531 is connected to the an electrode 505.

The electrode 505 is a coil spring in this example, but may be a cable or wire. The electrode 505 is electrically connected to the first conductor element 31. In this example the negative terminal 531 of the solar panel 5F electrically connects to the first conductor element 31, but when ground potential is applied to the negative terminal 531 of the solar panel 5F, the positive terminal 532 may be electrically connected to the first conductor element 31. In other words, whichever of the negative terminal 531 and negative terminal 531 of the solar panel 5F the ground potential is applied may be connected to the first conductor element 31.

The positive terminal 532 is connected to the electrode 506 as a connector. The electrode 506 is a coil spring in this example, but may be a cable or wire. The electrode 506 is connected to the circuit board 22. The electrode 506 is located in plan view between the antenna 3F and the case body 11. Because only electrode 506 of electrodes 505 and 506 is located between the antenna 3F and case body 11, there is no need to provide a space between the antenna 3F and case body 11 to locate both electrodes 505 and 506. More specifically, space sufficient to hold only electrode 506 is needed between the antenna 3F and case body 11. As a result, the size of the electronic timepiece 100F can be reduced.

The present invention is described with reference to preferred embodiments described above, but the invention is not limited thereby. The configurations of parts of the invention can also be replaced by desirable configurations of the same or equivalent function, and other desirable configurations can be added.

A GPS antenna with the ability to receive GPS satellite signals is used as an example of the antenna in the foregoing embodiments, but the antenna may be configured in various ways having at least a first conductor element, second conductor element, and shorting element, and is not limited to being a GPS antenna. For example, the antenna may be configured to receive satellite signals from other positioning information satellites such as used in the Galileo (EU), GLONASS (Russia), and BeiDou (China) systems, or to receive satellite signals from geostationary satellites such as SBAS or quasi-zenith satellites. The antenna may also be configured to receive Bluetooth or other wireless near-field communication signals. Note that Bluetooth is a registered trademark.

The electronic timepiece of the invention is also not limited to a wristwatch, and may be a table clock, wall clock, or other type of timepiece.

The invention being thus described, it will be obvious that it may be varied in many ways. Such variations are not to be regarded as a departure from the spirit and scope of the invention, and all such modifications as would be obvious to one skilled in the art are intended to be included within the scope of the following claims.

What is claimed is:

1. An electronic timepiece comprising:
a pivot to which a hand is attached;
an antenna having a first conductor element connected to a feed, a second conductor element disposed superimposed with the first conductor element in plan view, a shorting element that shorts the first conductor element and second conductor element, a through-hole through which the pivot passes disposed to the first conductor element and second conductor element, and the shorting element disposed to a position other than the through-hole;
a solar panel;
a circuit board electrically connected to the feed;
a case having a side wall and housing the antenna, the solar panel, the circuit board, and the feed; and
a connector disposed to a third area excluding from a first area surrounded by the side wall a second area defined by an imaginary line indicating a position one-third the distance from the center of the first conductor element or the second conductor element to an outside circumference, and electrically connecting the solar panel and the circuit board.

2. The electronic timepiece described in claim 1, wherein:
in plan view, an angle formed by a first line segment through the connector and a center of either the first conductor element or second conductor element, and a second line segment through the shorting element and the center of the first conductor element or second conductor element, is greater than or equal to 0° and less than or equal to 150°.

3. The electronic timepiece described in claim 2, wherein:
the angle is greater than or equal to 0° and less than or equal to 90°.

4. The electronic timepiece described in claim 3, wherein:
the angle is greater than or equal to 0° and less than or equal to 30°.

5. The electronic timepiece described in claim 1, wherein:
the connector is disposed in plan view between the antenna and the side wall.

6. The electronic timepiece described in claim 5, wherein:
the connector is disposed in plan view between the shorting element and the side wall.

7. The electronic timepiece described in claim 1, wherein:
the solar panel has a positive terminal and a negative terminal, one of the positive terminal and negative terminal is connected by the connector to the circuit board, and the other terminal is electrically connected to the first conductor element.

8. The electronic timepiece described in claim 1, wherein:
the antenna is disposed in a side view between the circuit board and the solar panel.

* * * * *